United States Patent
Kawagoe et al.

(10) Patent No.: US 11,849,546 B2
(45) Date of Patent: Dec. 19, 2023

(54) PRINTED WIRING BOARD AND MANUFACTURING METHOD FOR PRINTED WIRING BOARD

(71) Applicant: KYOCERA Corporation, Kyoto (JP)

(72) Inventors: Atsuo Kawagoe, Toyama (JP); Naoki Asaba, Shimoniikawa-gun (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 17/762,435

(22) PCT Filed: Sep. 25, 2019

(86) PCT No.: PCT/JP2019/037724
§ 371 (c)(1),
(2) Date: Mar. 22, 2022

(87) PCT Pub. No.: WO2021/059416
PCT Pub. Date: Apr. 1, 2021

(65) Prior Publication Data
US 2022/0338357 A1    Oct. 20, 2022

(51) Int. Cl.
*H05K 3/46*    (2006.01)
*H05K 1/11*    (2006.01)
(Continued)

(52) U.S. Cl.
CPC ........... *H05K 3/4697* (2013.01); *H05K 1/113* (2013.01); *H05K 1/185* (2013.01); *H05K 3/4661* (2013.01);
(Continued)

(58) Field of Classification Search
CPC .. H05K 3/4697; H05K 3/4661; H05K 3/0026; H05K 1/113; H05K 1/185; H05K 2203/0207
(Continued)

(56) References Cited

U.S. PATENT DOCUMENTS 8,575,763 B2 * 11/2013 Yoshida ............... H01L 25/105
257/E23.129
2006/0138638 A1    6/2006 Komatsu
(Continued)

FOREIGN PATENT DOCUMENTS

JP    10-093251 A    4/1998
JP    2005-011837 A    1/2005
(Continued)

*Primary Examiner* — Andargie M Aychillhum
(74) *Attorney, Agent, or Firm* — Volpe Koenig

(57) ABSTRACT

A printed circuit board which improves the peel strength of a wiring pattern formed at a cavity bottom portion while enabling connection between an electronic component inside a cavity and a circuit outside the cavity to be performed at the cavity bottom portion, includes a cavity in a partial region of a multilayer substrate laminated with an insulating resin layer and an electrical conductor layer on a bottom layer of an insulating resin substrate. The cavity opens on a side of the insulating resin substrate, penetrates the insulating resin substrate, and includes a surface of the insulating resin layer as a bottom surface. The electrical conductor layer has a surface, the surface having a height equivalent to a height of the surface of the insulating resin layer and being embedded in the insulating resin layer in a manner to form a portion of the bottom surface.

5 Claims, 13 Drawing Sheets

(51) Int. Cl.
  *H05K 1/18*   (2006.01)
  *H05K 3/00*   (2006.01)
(52) U.S. Cl.
  CPC ... *H05K 3/0026* (2013.01); *H05K 2203/0207* (2013.01)
(58) Field of Classification Search
  USPC .......................................................... 361/761
  See application file for complete search history.

(56) References Cited

U.S. PATENT DOCUMENTS

| | | | |
|---|---|---|---|
| 2008/0151517 A1* | 6/2008 | Sakamoto | H01L 23/13 361/761 |
| 2011/0147924 A1 | 6/2011 | Kaneko et al. | |
| 2018/0116057 A1 | 4/2018 | Kajihara et al. | |

FOREIGN PATENT DOCUMENTS

| | | |
|---|---|---|
| JP | 2011-129808 A | 6/2011 |
| JP | 2015-126182 A | 7/2015 |
| JP | 2016-122728 A | 7/2016 |
| JP | 2019-046860 A | 3/2019 |
| JP | 2019-047063 A | 3/2019 |
| JP | 2019-121626 A | 7/2019 |
| JP | 2019-176068 A | 10/2019 |

* cited by examiner

PRINTED WIRING BOARD AND MANUFACTURING METHOD FOR PRINTED WIRING BOARD

TECHNICAL FIELD

The present disclosure relates to a printed wiring board having a cavity and a manufacturing method for a printed wiring board.

BACKGROUND ART

In recent years, as a substrate and a wiring have become highly integrated and highly dense, a cavity may be provided in a multilayer substrate and an electronic component may be mounted therein. When an electronic component is mounted in a cavity, it is desirable to improve the peel strength of a wiring pattern formed in a cavity bottom portion.

In a conventional printed wiring board, a cavity is formed as described below. For example, in a case where a cavity is formed in a printed wiring board by a counterboring process in which a drill or a laser is used, the printed wiring board is provided with a release layer inside in advance. Then, the drill or the laser machines from the surface of the printed wiring board to the release layer. The upper portion structure of the release layer is removed from the release layer as a boundary to form a cavity. Thereafter, the release layer is removed.

In addition, for the purpose similar to that of the release layer, the printed wiring board is provided with a dummy pattern inside in advance. Next, from the surface of the printed wiring board to the dummy pattern is irradiated with a laser, and the upper portion structure is removed to form a cavity. In this case, the dummy pattern is removed by etching.

CITATION LIST

Patent Literature

Patent Document 1: JP 2016-122728 A

SUMMARY OF INVENTION

Technical Problem

In the above-described conventional technique, there exist the following cases.

In the technique of providing a release layer inside a printed wiring board, since a release layer which is a secondary material is used, the member cost and the cost of forming the release layer may increase. Further, in the case of this technique, it is difficult to adjust the layer configuration between the upper layer of the release layer and the peripheral layer, and furthermore, the insulating layer or wiring may be deflected, and the plate thickness of the periphery may be increased. Further, in the conventional technique of providing a dummy pattern, the dummy pattern is finally removed by etching. Therefore, the wiring connected to the pad cannot be formed, and it is difficult for the electronic component housed in the cavity to be connected to the circuit wiring of the bottom portion.

In addition, although there is a technique of flattening the bottom portion by a drilling process without using the dummy pattern or the release layer, fine accuracy is required for depth adjustment during a machining process, which may result in over-cutting or under-cutting.

The present disclosure allows an electronic component inside a cavity to be connected to a circuit outside the cavity, at a cavity bottom portion. Further, there is provided a printed wiring board and a manufacturing method for the printed wiring board with high peel strength of the wiring pattern formed on the cavity bottom portion.

Solution to Problem

A printed wiring board according to the present disclosure includes a cavity in a partial region of a multilayer substrate laminated with an insulating resin layer and an electrical conductor layer on a bottom layer of an insulating resin substrate. The cavity opens on a side of the insulating resin substrate, penetrates the insulating resin substrate, and includes a surface of the insulating resin layer as a bottom surface. The electrical conductor layer includes a surface, the surface having a height equivalent to a height of the surface of the insulating resin layer and being embedded in the insulating resin layer in a manner to form a portion of the bottom surface.

A manufacturing method for a printed wiring board according to the present disclosure, the method includes the steps of: performing pattern plating on a partial region of a seed layer to form an electrical conductor layer, the seed layer being provided on a second face of a substrate made of insulating resin, the substrate comprising a first face and the second face; forming a first insulating resin layer on the first face of the substrate and forming a second insulating resin layer such that the electrical conductor layer is embedded in the second face of the substrate; drilling in a lamination direction from a side of the first insulating resin layer toward the partial region of the seed layer to penetrate the first insulating resin layer, and removing the insulating resin constituting the substrate such that a portion of the substrate remains on the partial region of the seed layer inside the substrate to form a cavity; removing, by laser machining, the portion of the substrate that remains in the cavity by using the partial region of the seed layer as a shielding member of a laser beam to expose the partial region of the seed layer at a bottom portion of the cavity; and removing the partial region of the seed layer exposed at the bottom portion of the cavity by flash etching to expose a surface of the second insulating resin layer and a surface of the electrical conductor layer embedded in the second insulating resin layer.

Advantageous Effects of Invention

According to the present disclosure, an electronic component inside a cavity can be connected to a circuit outside the cavity, at a cavity bottom portion. Further, the wiring pattern formed at the cavity bottom portion enables the peel strength to improve.

DESCRIPTION OF EMBODIMENTS

Embodiments according to the present disclosure will be described below with reference to the drawings.

Figure 10:
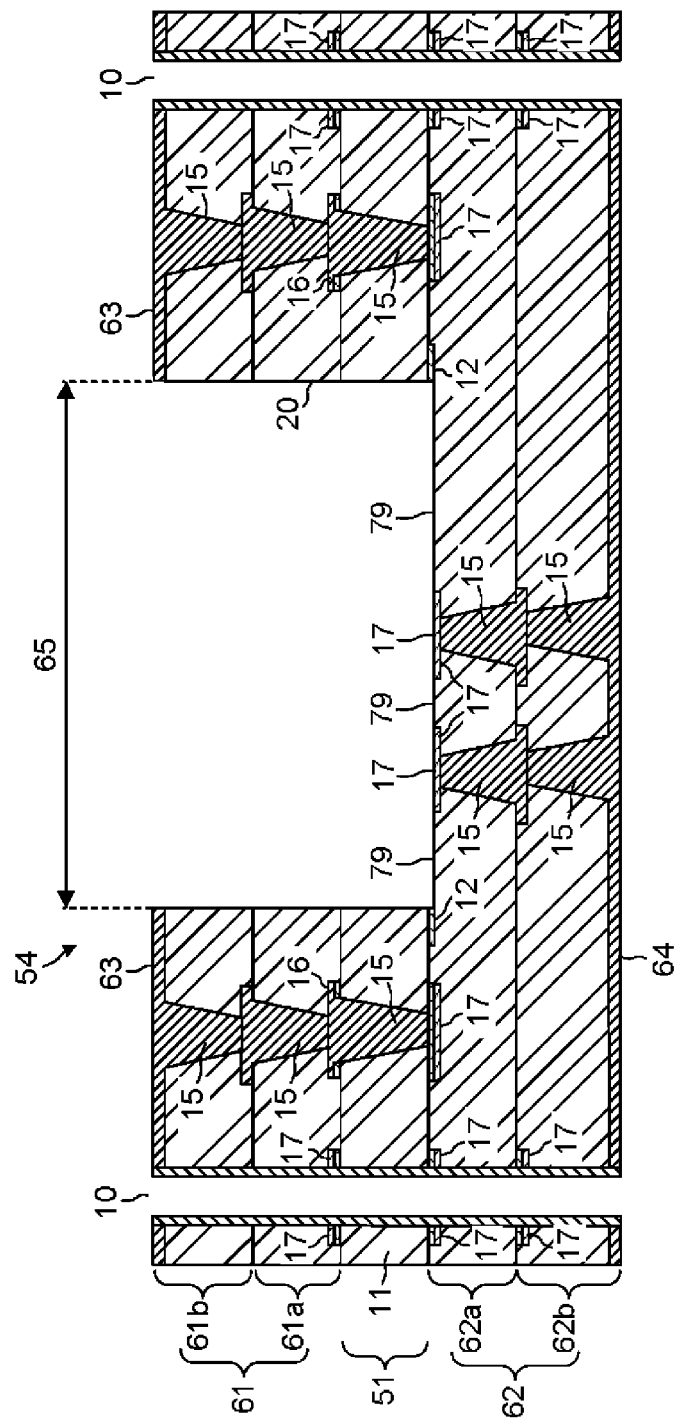
FIG. 10 is a cross-sectional view illustrating a manufacturing method for a printed wiring board according to one embodiment.

FIG. 10 illustrates a configuration of a printed wiring board according to one embodiment of the present disclosure.

As illustrated in FIG. 10, a printed wiring board of this embodiment includes a cavity 20 having an upper opening in a cavity forming region 65 which is a partial region of a multilayer substrate 54. The printed wiring board is a multi-layered substrate structure including a core substrate 51 with a substrate 11 made of insulating resin (hereinafter, an insulating resin substrate 11), where a first build-up layer 61 is laminated on an upper surface (first face) of the insulating resin substrate 11, and a second build-up layer 62 is laminated on an lower surface (second face) of the insulating resin substrate 11. The first build-up layer 61 includes a first insulating resin layer 61a and a third insulating resin layer 61b in order from the insulating resin substrate 11 side. The second build-up layer 62 includes a second insulating resin layer 62a and a fourth insulating resin layer 62b in order from the insulating resin substrate 11 side. The multilayer substrate 54 further includes electrical conductor layers 16, 17, 63 and 64 between or on the insulating resin substrate 11 and the insulating resin layers.

The cavity 20 penetrates the first build-up layer 61 and the insulating resin substrate 11 and is a recessed portion having a cross-section concave shape, in which a surface 79 of the insulating resin of the second insulating resin layer 62a included in the second build-up layer 62 is a bottom surface thereof. The printed wiring board includes the electrical conductor layer 17 with a surface, the surface having a height equivalent to that of a surface 79 of the second insulating resin layer 62a included in the second build-up layer 62, the surface being embedded in the second insulating resin layer 62a in a manner to form a portion of the bottom surface of the cavity 20.

In the printed wiring board illustrated in FIG. 10, the configuration without the first build-up layer 61 is also within the category of the printed wiring board according to the embodiment of the present disclosure. Furthermore, a configuration in which the first build-up layer 61 and the fourth insulating resin layer 62b of the second build-up layer 62 are not included is also within the category of the printed wiring board according to the embodiment of the present disclosure.

Further, in the printed wiring board illustrated in FIG. 10, the cavity 20 may be configured such that the upper surface of the fourth insulating resin layer 62b is the bottom surface instead of the upper surface of the second insulating resin layer 62a being the bottom surface. In this case, the printed wiring board according to the embodiment has a configuration to include the electrical conductor layer 17 with a surface, the surface having a height equivalent to that of an upper surface of the fourth insulating resin layer 62b, the surface being embedded in the fourth insulating resin layer 62b in a manner to form a portion of the bottom surface of the cavity 20.

The printed wiring board includes an electrical conductor layer (the electrical conductor layer 16, the electrical conductor layer 17) including the electrical conductor layer 17 that forms a portion of the bottom surface of the cavity 20, in any portion other than the portion of the cavity 20. A via 15 interconnects electrical conductor layers (the electrical conductor layer 16, the electrical conductor layer 17). The multilayer substrate 54 includes a through-hole 10 that penetrates and connects the electrical conductor layer 63 and the electrical conductor layer 64 at both ends, and the electrical conductor layer 17 vertically (in the lamination direction). Although the electrical conductor layer 16 and the electrical conductor layer 17 are electrically the same, an electrical conductor layer formed integrally with the via 15 is referred to as the electrical conductor layer 16, and an electrical conductor layer laminated on a seed layer 12, which will be described later, is referred to as the electrical conductor layer 17.

The first build-up layer 61 includes the electrical conductor layer 16 each on the insulating resin substrate 11 side of the first insulating resin layer 61a and on the insulating resin substrate 11 side of the third insulating resin layer 61b. The first insulating resin layer 61a and the third insulating resin layer 61b are each provided with the via 15. The core substrate 51 includes the via 15 that penetrates the insulating resin substrate 11 and connects to the electrical conductor layer 16 on the insulating resin substrate 11 side of the first insulating resin layer 61a. On the upper surface of the third insulating resin layer 61b, the electrical conductor layer 63, which is connected to the via 15 provided in this layer, is formed.

The second insulating resin layer 62a and the fourth insulating resin layer 62b, included in the second build-up layer 62, are each provided with the via 15 within the cavity forming region 65 and directly below the cavity 20. The via 15 directly below the cavity 20 is connected to the electrical conductor layer 17 including an upper surface forming a portion of the bottom surface of the cavity 20. The electrical conductor layer 17 on the bottom surface of the cavity 20, for example, is what the electrical conductor layer 17 formed on the lower surface of the insulating resin substrate 11 in the core substrate 51 remains after the cavity is formed as described below.

In the manufacturing process of the printed wiring board, the seed layer 12 is formed in a range including the cavity forming region 65 on the lower surface of the insulating resin substrate 11, and the electrical conductor layer 17 is further formed on the lower surface of the seed layer 12, thereby forming the core substrate 51. When the cavity 20 is formed in the multilayer substrate using the core substrate 51, the insulating resin substrate 11 and the seed layer 12 of the core substrate 51 are removed by a counterboring process, etching, or the like, and only the electrical conductor layer 17 remains as described above.

In the cavity 20, a bottom surface is formed such that the surface 79 of the insulating resin of a partial region of a predetermined layer of the multilayer substrate 54 (the second insulating resin layer 62a in FIG. 10) and, for example, an upper surface of the electrical conductor layer 17, which is to be a connection pad left by the above-described processing, are exposed at the same height (in a flat state), and are substantially flush with each other. It should be noted that "substantially" is described because the seed layer 12 is etched to expose the electrical conductor layer 17, a slight (2 µm to 3 µm) step may occur depending on the state of etching. More specifically, the cavity 20 can be formed, for example, by the methods described later.

For example, a portion of the electrical conductor layer 17 becomes a connection pad with an electronic component on the bottom surface of the cavity 20. Further, the electrical conductor layer 17 may be a circuit wiring connected to the connection pad in a planar direction. The electrical conductor layer 17 is formed in a layer requiring circuit connection of an inner layer of the multilayer substrate 54 and is connected to the through-hole 10.

The through-hole 10 is provided so as to penetrate the multilayer substrate 54 vertically (in the lamination direction of the substrate) in a portion outside the region of the cavity 20 of the multilayer substrate 54.

An electrical conductor layer 73, an electrical conductor layer 74 (see FIG. 13), and a solder resist 71, a solder resist 72 (see FIG. 13) are formed on the top and bottom of the through-hole 10, as necessary. The solder resist 71 and the solder resist 72 are formed on the surface of the uppermost layer and/or the lowermost layer of the multilayer substrate 54. The electrical conductor layer 73 and the electrical conductor layer 74, allowing their peripheries to be coated with insulating coating film by the solder resist 71 and the solder resist 72, function as connection pads.

An electronic component housed in the cavity 20 is, for example, a bare tip (integrated circuit (IC) unpackaged without terminals) or the like, and includes an electrode for connection to the multilayer substrate 54 in the bottom portion of the electronic component. The electrode in the bottom portion of the electronic component may be connected to the surface of the electrical conductor layer 17 exposed flat at the cavity bottom portion as a component mounting land, or may be connected via a metal plating layer 80 (see FIG. 13) formed by plating on the electrical conductor layer 17. In this case, the metal plating layer 80 is formed by laminating a plating layer such as nickel plating or gold plating.

The electrical conductor layer 63 and the electrical conductor layer 64 are formed on the surfaces of the multilayer substrate 54 (the core substrate 51 and the first and second build-up layers 61, 62 thereabove and therebelow), and are formed as a portion of the circuit wiring (an electrical conductor layer 63a) in the subsequent etching. The electrical conductor layer 63 and the electrical conductor layer 64 are solid copper patterns, and are formed, for example, by applying copper plating (approximately 15 µm thick) to a copper foil (approximately 9 µm thick).

The via 15 is connected to the extending end (along the plane) of the electrical conductor layer 63 and the electrical conductor layer 64. The via 15 interconnects the electrical conductor layers (the electrical conductor layer 16, the electrical conductor layer 17, the electrical conductor layer 63, the electrical conductor layer 64, or the like) provided on a upper surface or a lower surface of an arbitrary insulating resin layer (including an insulating resin substrate) of the multilayer substrate 54.

The core substrate 51 is formed by processing the insulating resin substrate 11 (see FIG. 5) in which the seed layers 12 have been formed on the upper and lower surfaces, to form the via 15.

Examples of the insulating resin forming the insulating resin substrate 11 include epoxy resin, bismaleimide-triazine resin, polyimide resin, polyphenylene ether (PPE) resin, phenol resin, polytetrafluoroethylene (PTFE) resin, silicone resin, polybutadiene resin, polyester resin, melamine resin, urea resin, polyphenylene sulfide (PPS) resin, and polyphenylene oxide (PPO) resin, or the like. Two or more kinds of these resins may be mixed.

Figure 6:
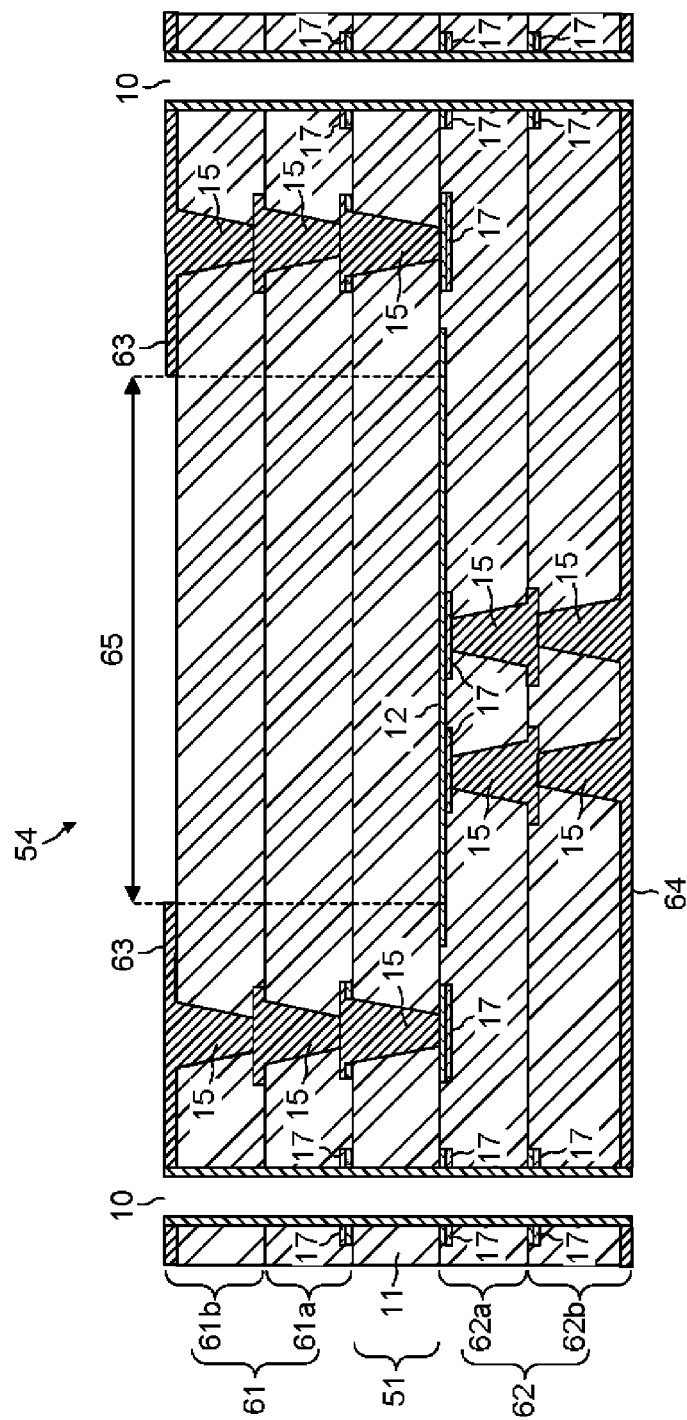
FIG. 6 is a cross-sectional view illustrating a manufacturing method for a printed wiring board according to one embodiment.

The via 15 is obtained by filling a via hole 14 (see FIG. 2) with metal plating by plating treatment. The via 15 is for interlayer connection of the electrical conductor layers (the electrical conductor layer 63, the electrical conductor layer 64, the electrical conductor layer 16, the electrical conductor layer 17, or the like) provided in the respective layers (including an inner layer and an outer layer) of the multilayer substrate 54 (see FIG. 6). In FIG. 6, the electrical conductor layer 63 on the upper surface is connected to the electrical conductor layer 16 through the via 15, and the electrical conductor layer 64 on the lower surface is connected to the electrical conductor layer 16 through the via 15.

The seed layer 12 is, for example, made of copper having a thickness of 1 µm or more to 10 µm or less, and is disposed in a state where a portion thereof remains on the insulating resin substrate 11 side of the electrical conductor layer 17. The seed layer 12 is not particularly limited as long as it is electrically connected and can shield the laser, and for example, a thin copper foil or electroless copper plating is used. A thin copper foil with a dense metal composition is more suitable.

Figure 5:
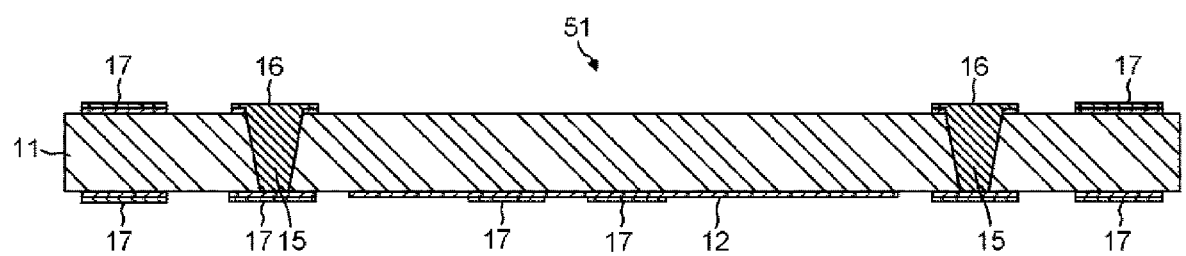
FIG. 5 is a cross-sectional view illustrating a manufacturing method for a printed wiring board according to one embodiment.

The core substrate 51 is obtained by forming a circuit on the upper and the lower surfaces of the insulating resin substrate 11 by a technique such as a modified semi-additive process (M-SAP) or a semi-additive process (SAP). The electrical conductor layer 17 (center portion on the lower surface of the core substrate 51 in FIG. 5) serves as a connection pad or a circuit wiring provided in a partial region of the seed layer 12, and the seed layer 12 in FIG. 5 is exposed while protected with etching resist against flash etching.

FIGS. 1 to 13 illustrate an embodiment of a manufacturing method for a printed wiring board.

Insulating Layer Processing Step

Figure 1:
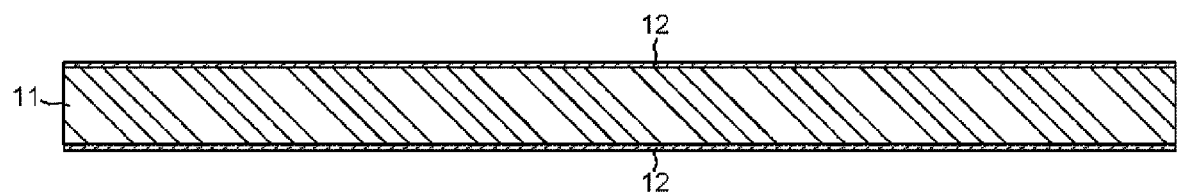
FIG. 1 is a cross-sectional view illustrating a manufacturing method for a printed wiring board according to one embodiment.

As illustrated in FIG. 1, the insulating resin substrate 11 has a first face and a second face back to back. One of the first face and the second face of the insulating resin substrate 11 is referred to as a lower surface, and in the following description, the second face of the insulating resin substrate 11 is referred to as the lower surface. The seed layer 12 is formed on the upper surface (first face) and the lower surface (second face) of the insulating resin substrate 11. Alternatively, the insulating resin substrate 11 in which the seed layer 12 has been formed may be prepared. The seed layer 12 may be, for example, a conductive metal foil such as a thin copper foil having a thickness of, for example, approximately 1 μm to 10 μm.

Figure 2:
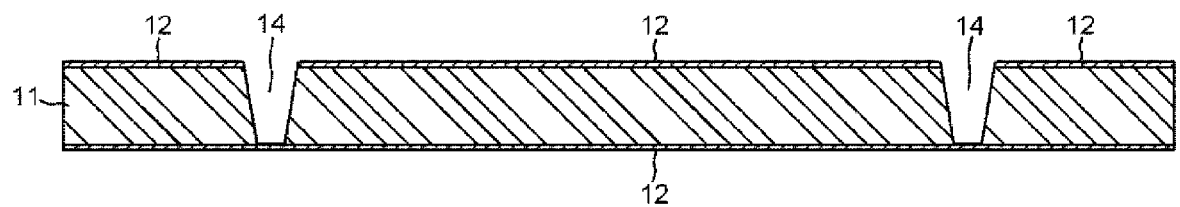
FIG. 2 is a cross-sectional view illustrating a manufacturing method for a printed wiring board according to one embodiment.

Subsequently, as illustrated in FIG. 2, in the insulating resin substrate 11 on which the seed layer 12 has been formed, the via hole 14 is formed by a laser machining process from the upper surface to the lower surface.

When the via hole 14 is formed by the laser machining process, a thin resin film may remain on the bottom portion of the via hole 14. In this case, desmear treatment is performed. The desmear treatment involves swelling the resin with a strong alkali and then decomposing and removing the resin using an oxidizing agent (e.g., chromium acid, aqueous permanganate solution, etc.).

Alternatively, the resin film may be removed by, for example, wet blasting treatment with an abrasive or plasma treatment. Further, the inner wall surface of the via hole 14 may be roughened for the plating treatment. Examples of the surface roughening treatment include a wet processing using an oxidizing agent (for example, chromic acid or an aqueous permanganate solution) and a dry processing such as plasma treatment or ashing treatment.

Pattern Plating Treatment Step

Figure 3:
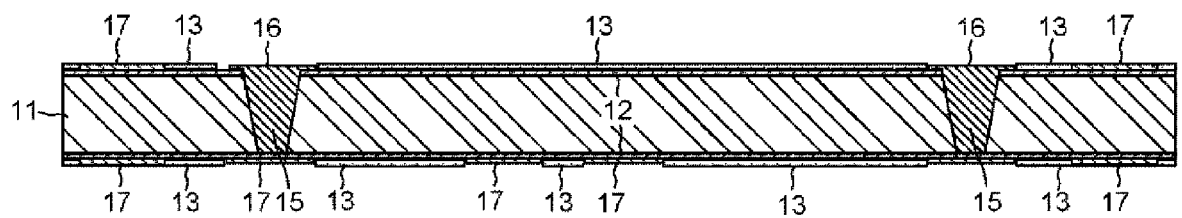
FIG. 3 is a cross-sectional view illustrating a manufacturing method for a printed wiring board according to one embodiment.

As illustrated in FIG. 3, in this step, pattern plating is performed on a portion of a partial region of the seed layer 12 provided on the upper and the lower surfaces of the insulating resin substrate 11 and on the via hole 14, to form the electrical conductor layer 16, the electrical conductor layer 17, and the via 15.

Specifically, a dry film 13 (plating resist) is attached to the upper portion of the seed layer 12 by a laminating process. Thereafter, exposure and development are performed. Portions of the dry film 13, which become the electrical conductor layer 16 on the upper surface of the seed layer 12 on the upper surface of the insulating resin substrate 11, a circuit portion such as the via 15, and the electrical conductor layer 17 which is a conductive circuit on the lower surface of the seed layer 12 on the lower surface of the insulating resin substrate 11, are removed.

Subsequently, the insulating resin substrate 11 in which the portions of the dry film 13 have been removed is subjected to pattern plating treatment on the via hole 14 for forming the circuit portion and the seed layer 12 around the via hole 14. In the insulating resin substrate 11, the electrical conductor layer 16 and the electrical conductor layer 17 of the seed layer 12 of the upper surface of the insulating resin substrate 11, the via 15 inside the insulating resin substrate 11, and the electrical conductor layer 17 of the lower surface of the seed layer 12 on the lower surface of the insulating resin substrate 11, are formed.

The pattern plating is based on copper plating. However, when the seed layer 12 is removed in a later step, the pattern plating portion may be slightly etched. In this case, continuous plating of pattern nickel plating plus pattern copper plating are performed as a barrier to removal of the seed layer 12. The nickel plating has a thickness of 2 μm or more.

This nickel plating treatment is referred to as "barrier plating". In a case where this stage of plating also serves as plating for surface treatment of component mounting, continuous plating is performed in order of nickel plating, gold plating, nickel plating, and copper plating. Also in this case, the thickness of the nickel plating is set to 2 μm or more for the first time and 3 μm or more for the second time, and the thickness of the gold plating is set to 0.3 μm or more in the case of wire bonding although it depends on how the components are mounted.

The correction of the circuit width may be the same as that in the normal M-SAP or semi-additive method, and the exposure may be performed after correcting the circuit width to be thicker by approximately the design value plus 6 μm.

Dry Film Peeling Step

After the pattern plating treatment, the remaining dry film 13 is peeled to expose the seed layer 12.

Processing Step of Cavity Forming Region

Figure 4:
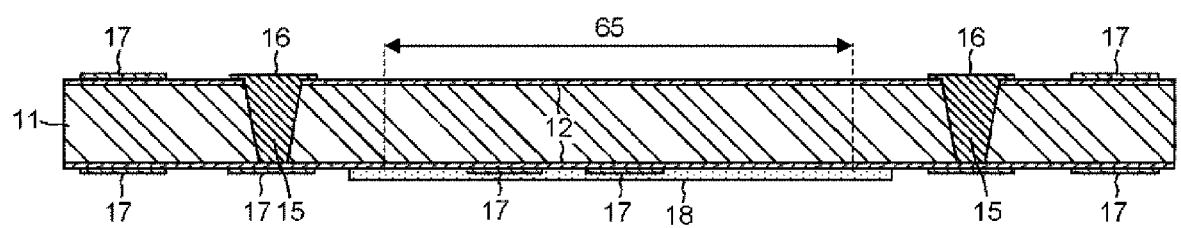
FIG. 4 is a cross-sectional view illustrating a manufacturing method for a printed wiring board according to one embodiment.

As illustrated in FIG. 4, a dry film 18 (photosensitive etching resist) is attached, by the laminating process, to the seed layer 12 and the electrical conductor layer 17 on the lower surface of the insulating resin substrate 11. Thereafter, exposure and development are performed. The dry film 18 is left in the range including the cavity forming region 65, and is removed in the other range. A portion of the exposed seed layer 12 other than the dry film 18, which is not necessary as a conductive circuit is removed by flash etching, and finally the dry film 18 is peeled.

In this way, the core substrate 51 as illustrated in FIG. 5 is completed. In this core substrate 51, the electrical conductor layer 16 is formed on the upper surface of the insulating resin substrate 11 as a portion of a circuit connected to the via 15, and the seed layer 12 is formed on the lower surface of the insulating resin substrate 11 in a manner to include a range of the cavity forming region 65. A portion of the seed layer 12 in a range including the cavity forming region 65 serves as a laser receiver (shielding member) during the laser machining process described later. Also, the electrical conductor layer 17 as a conductive circuit is formed on the lower surface of the cavity forming region 65 of the seed layer 12 on the lower surface of the insulating resin substrate 11. In this example, the circuit is formed using M-SAP as an example, but the circuit can also be formed using SAP using electroless copper plating to a seed layer.

Build-Up Layer Forming Step

In this step, as illustrated in FIG. 6, the first build-up layer 61 as a build-up layer is formed on the upper surface of the insulating resin substrate 11 of the core substrate 51, and the second build-up layer 62 as a build-up layer is formed on the lower surface of the insulating resin substrate 11 of the core substrate 51.

That is, in the core substrate 51, among the upper layer (upper surface of the insulating resin substrate 11) and the lower layer (lower surface of the insulating resin substrate 11), at least in the lower layer, an arbitrary number of build-ups are performed to manufacture the multilayer substrate 54. In other words, in this step, a multilayer substrate 54 is formed in which the seed layer 12 is embedded inside between the insulating resin substrate 11 and the second build-up layer 62.

For the circuit formation of the first build-up layer 61 and the second build-up layer 62, for example, not only a subtractive process of removing an unnecessary conductor as a circuit by etching, but also M-SAP, SAP, or the like similar to the case of the core substrate 51 can be applied. Techniques such as multi-stage pressing or resin lamination are applied to laminate the first build-up layer 61 and the second build-up layer 62.

In this example, the first build-up layer 61 as an upper layer includes two insulating resin layers, namely, the first insulating resin layer 61a, the third insulating resin layer 61b, the electrical conductor layer 16, and the electrical conductor layer 17. On the upper surface of the third insulating resin layer 61b as the uppermost layer (surface layer), the electrical conductor layer 63 connected to the via 15, is formed. The range of the cavity forming region 65 is removed when forming the electrical conductor layer 63 on the upper surface of the multilayer substrate 54. This is to facilitate the counterboring process in the cavity forming step described later.

The second build-up layer 62 includes two insulating resin layers, namely, the second insulating resin layer 62a and the fourth insulating resin layer 62b, and the electrical conductor layer 16, the electrical conductor layer 17. The second insulating resin layer 62a immediately below the core substrate 51 includes the via 15 formed in the range of the cavity forming region 65, connects with the electrical conductor layer 17 of the core substrate 51 in the upper portion, and connects to the via 15 of the fourth insulating resin layer 62b of the bottom layer in the lower portion. The electrical conductor layer 64 connected to the via 15 is formed on the lower surface of the fourth insulating resin layer 62b as the lowest layer (surface layer). The electrical conductor layer 17 is formed on the left and right lower surfaces of the second insulating resin layer 62a and the fourth insulating resin layer 62b. The through-hole 10 is formed to penetrate this electrical conductor layer 17, whereby interlayer connection of the through-hole 10 is established with the electrical conductor layers 17 of the other layers, the electrical conductor layer 63 of the uppermost layer, and the electrical conductor layer 64 of the lowermost layer.

Cavity Forming Step

This step includes two steps of a counterboring process 1 and a counterboring process 2. In the counterboring process 1, the cavity forming region 65 is drilled in the lamination direction from the upper surface of the first build-up layer 61 toward the seed layer 12 on the lower surface of the insulating resin substrate 11. The cavity 20 is formed by penetrating the first build-up layer 61, and by removing the insulating resin constituting the insulating resin substrate 11 such that a portion 68 of the insulating resin substrate 11 remains on a partial region of the seed layer 12 inside the insulating resin substrate 11. In the counterboring process 2, by using the seed layer 12 as the shielding member of the laser beam, the portion 68 that remains is removed, which is a portion of the insulating resin substrate 11 left in the cavity 20, by the laser machining process, to expose the seed layer 12 at the bottom of the cavity 20.

Counterboring Process 1 (Drilling Process)

In this step, from above the multilayer substrate 54 to the insulating resin substrate 11 in the core substrate 51 through the first build-up layer 61 of the cavity forming region 65, a counterboring process (machining process using both drilling process and laser machining process is also possible) is performed. The portion 68 of the insulating resin substrate 11 is left on the seed layer 12 on the lower surface of the insulating resin substrate 11, and most of the insulating resin is removed to form the cavity 20. In the counterboring process 1, for example, the insulating resin substrate 11 is machined from its upper surface to a depth equal to or greater than the center of the plate thickness. "Depth equal to or greater than the center of the plate thickness" refers to a depth that is not less than ½ of the thickness of the insulating resin substrate 11 and that does not reach the seed layer 12.

Figure 7:
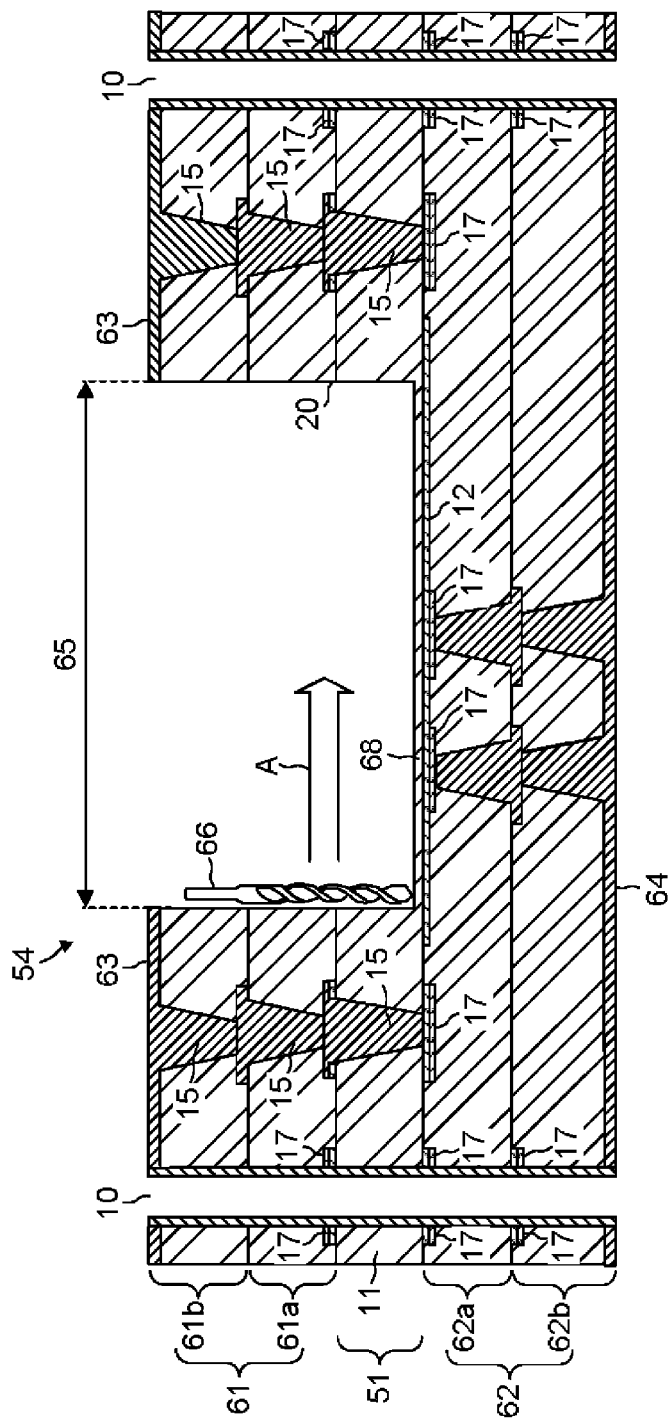
FIG. 7 is a cross-sectional view illustrating a manufacturing method for a printed wiring board according to one embodiment.

Specifically, as illustrated in FIG. 7, in the counterboring process 1, a drill 66, which has a sensor at a bit front end, is placed at one end (e.g., the left end toward the drawing) of the cavity forming region 65. Machining is performed to the position (position before reaching the bottom portion of the cavity 20) of the upper surface of the seed layer 12 on the surface of the core substrate 51, and the drill 66 is moved from that position in a direction A parallel to the laminated surface to remove the insulating resin substrate 11 by the drill 66.

Note that in this example, the portion 68 of the insulating resin substrate 11 is left on the bottom portion of the cavity 20, but when the accuracy of the drilling process is high, the machining may be performed to the very edge of the surface of the seed layer 12.

The reason the counterboring process is performed in two steps including not only the laser machining process described later but also the drilling process is that the seed layer 12 is used as a laser receiver (shielding member) of a laser of the laser machining process described later and that the portion 68 that remains, which is a portion of the insulating resin substrate 11, is removed.

Counterboring Process 2 (Laser Machining Process)

Figure 8:
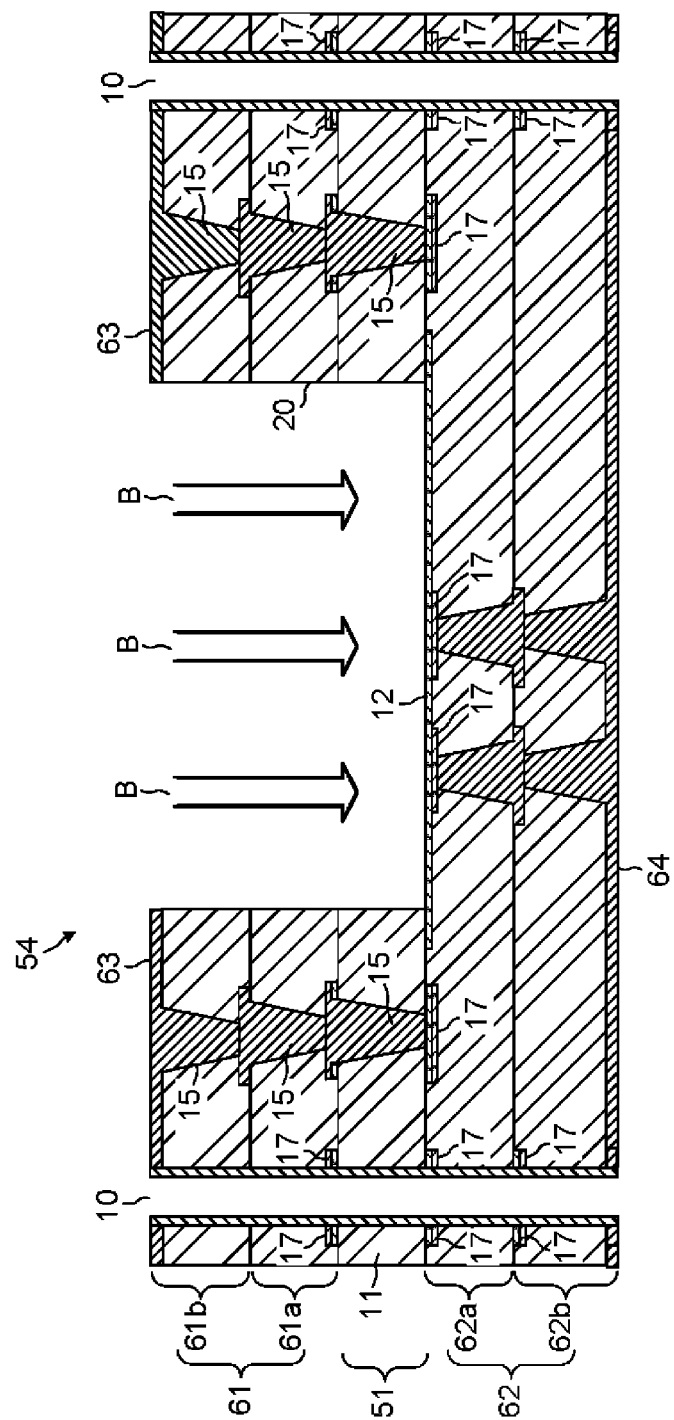
FIG. 8 is a cross-sectional view illustrating a manufacturing method for a printed wiring board according to one embodiment.

In this step, as illustrated in FIG. 8, from the upper of the opening of the cavity 20 is irradiated with a laser beam in a direction of arrow B, which is orthogonal to the laminated surface, to remove the portion 68 that remains at the bottom portion of the cavity 20 in the insulating resin substrate 11 in the drilling process of FIG. 7. For example, a processing laser such as a carbon dioxide laser ($CO_2$ laser) or a YAG laser can be applied to the laser machining process.

Figure 9:
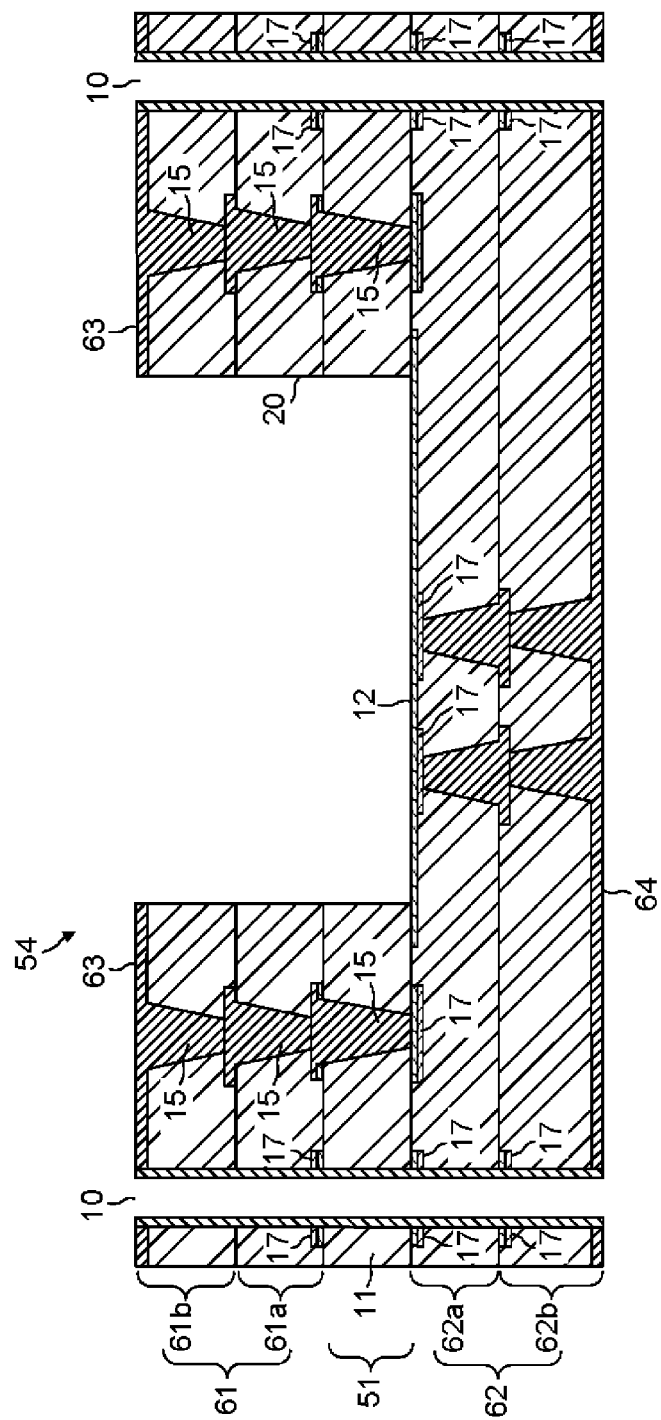
FIG. 9 is a cross-sectional view illustrating a manufacturing method for a printed wiring board according to one embodiment.

Thus, at the bottom of the cavity 20, the seed layer 12 is used as a shielding member of the laser beam, and the portion 68 of the insulating resin substrate 11 that remains at the bottom of the cavity 20 is removed by the laser machining process, which exposes a partial region of the seed layer 12 as shown in FIG. 9.

When the portion 68 of the insulating resin substrate 11 that remains at the bottom portion of the cavity 20 is machined by the laser machining process, a thin resin film (fine resin scrap) may remain in that portion. In order to remove the remaining fine resin scrap, the carbonized portion is cleaned by a laser. For this purpose, the desmear treatment is performed by washing with water treatment such as high-pressure washing, plasma treatment, permanganate treatment, or the like. These types of treatment may be performed twice or three times.

The desmear treatment is treatment which involves swelling the resin with a strong alkali and then decomposing and removing the resin using an oxidizing agent (e.g., chromium acid, aqueous permanganate solution, etc.). Alternatively, the resin film may be removed by wet blasting treatment with an abrasive, or plasma treatment. In the plasma treatment, masking may be performed with a dry film in order to protect the surface base member.

In addition, when the desmear treatment is performed, in order to protect the outermost layer base member and the outermost layer circuit, the process may be switched and the outermost layer circuit may be formed after formation of the cavity 20. In this case, the cavity 20 may be protected by a dry film or the like. Electrodeposition resist (such as ED) can also be used.

A surface area of the seed layer 12 that is a laser receiver (shielding member of the laser beam) may be formed to be wider than an area of a bottom surface of the cavity 20. In this case, since the seed layer 12 remains while inserted into the second insulating resin layer 62a of the second build-up layer 62 adjacent to the cavity 20 on the extension line of the bottom surface of the cavity 20, the remaining portion of the seed layer 12 can be used as a portion of the circuit.

Conversely, since the seed layer 12 is inserted into the second insulating resin layer 62a, when a plurality of circuits are to be extended from the electrical conductor layer 17 to the outside of the cavity, the plurality of circuits are shortcircuited by the seed layer 12. When the seed layer 12 is formed to be slightly narrower than the bottom surface of the cavity 20 in order to avoid this, the seed layer 12 is not inserted into the second insulating resin layer 62a. Since the surface position of the second insulating resin layer 62a differs by the depth of the seed layer 12 depending on the presence or absence of the seed layer 12, the applicability of the present disclosure can be easily verified.

Then, there may be a case where a region without a seed layer 12 is present in an end portion of the bottom portion of the cavity 20 and the region cannot shield the laser by the seed layer 12. However, in the case of a laser whose output is adjusted so as to be shielded by the seed layer 12 which is made of a thin copper of 1 μm to 10 μm, the second insulating resin layer 62a is not dug endlessly even without the seed layer 12, and the plurality of circuits can be extended outside the cavity without short-circuiting each other.

The copper foil (barrier layer) of the seed layer 12 at the bottom portion of the cavity 20 may be a profile free foil, a low profile foil, a standard foil, or the like.

In the present embodiment, formation of the outermost layer circuit is followed by formation of the cavity 20, but the cavity 20 may be formed before formation of the outermost layer circuit in order to protect the surface base member and prevent deterioration of circuit peel strength when desmear treatment such as permanganate acid treatment is performed after the laser treatment. Further, when formed by pattern plating of M-SAP or the like, the outermost layer circuit also serves as a seed layer removing step described later, and thus the number of steps can be reduced.

It should be noted that in a case where the portion that is hit by the laser beam during processing of the cavity 20 has an uneven shape, depending on the pattern design of the bottom portion of the cavity 20, there may be a case where the portion exists that is difficult to be hit by the laser beam and the portion 68 of the insulating resin substrate 11 that remains cannot be removed by the laser in some cases. When the portion 68 that remains exists after the laser machining process, the barrier layer may not be completely removed by flash etching in a later step. In this example, since the surface on which the laser hits is a flat surface of copper foil (barrier layer) of the seed layer 12, the surface is easy to be hit by the laser beam, and the portion 68 of the insulating resin substrate 11 that remains can be cleanly removed. For this reason, in the flash etching of the post-process, the seed layer 12, which is a barrier layer, can be removed entirely, thereby the yield is good.

Seed Layer Removing Step

In this step, as illustrated in FIG. 10, the seed layer 12 exposed at the bottom portion of the cavity 20 is removed by the flash etching to expose the surface 79 of the second insulating resin layer 62a of the second build-up layer 62 and the surface of the electrical conductor layer 17 embedded in the insulating resin.

More specifically, in this step, flash etching of the bottom portion of the cavity forming region 65 is performed to remove the seed layer 12 (copper foil) as a barrier layer. As a result, the surface 79 of the second insulating resin layer 62a, which is a lower layer of the core substrate 51, and the electrical conductor layer 17, whose surface is exposed at a height (position) equivalent to the surface 79 and which is embedded in the second insulating resin layer 62a, forms a portion of the bottom surface of the cavity 20. In this way, the electrical conductor layer 17 exposed flat at the bottom surface of the cavity 20 functions as a component mounting land, and the circuit wiring in the multilayer substrate 54 and the electronic component housed in the cavity 20 can be connected.

When it is not desired to reduce the conductor thickness of the outermost layer by flash etching, the flash etching is performed after solder resist. Alternatively, masking with a dry film may be performed after the solder resist, and a portion to be etched may be arbitrarily selected.

Although the case where the pattern plating portion is also slightly etched in addition to the seed layer has been described above, the possibility that the conductor thickness is adversely affected is low because the etching amount is about 2 μm and the flash etching solution has a property of uniformly etching in a direction orthogonal to the laminated surface.

In a case of nickel plating as barrier plating, nickel is further etched. A nickel remover NH-1860 series (manufactured by MEC COMPANY LTD.) or the like may be used for nickel etching.

When gold plating is performed under the nickel plating as barrier plating in a wire bonding application, a ferric chloride solution or cupric chloride solution, which is a typical etching solution of a subtractive method, can be used in principle because gold is not dissolved in them. However, due to the strong penetration into the interface, side etching occurs which penetrates into the interface between the gold plating and the insulating resin layer and which dissolves the nickel plating and the copper plating further below the gold plating, so that the ferric chloride solution or cupric chloride solution is inappropriate.

Outer Layer Circuit Forming Step

Figure 11:
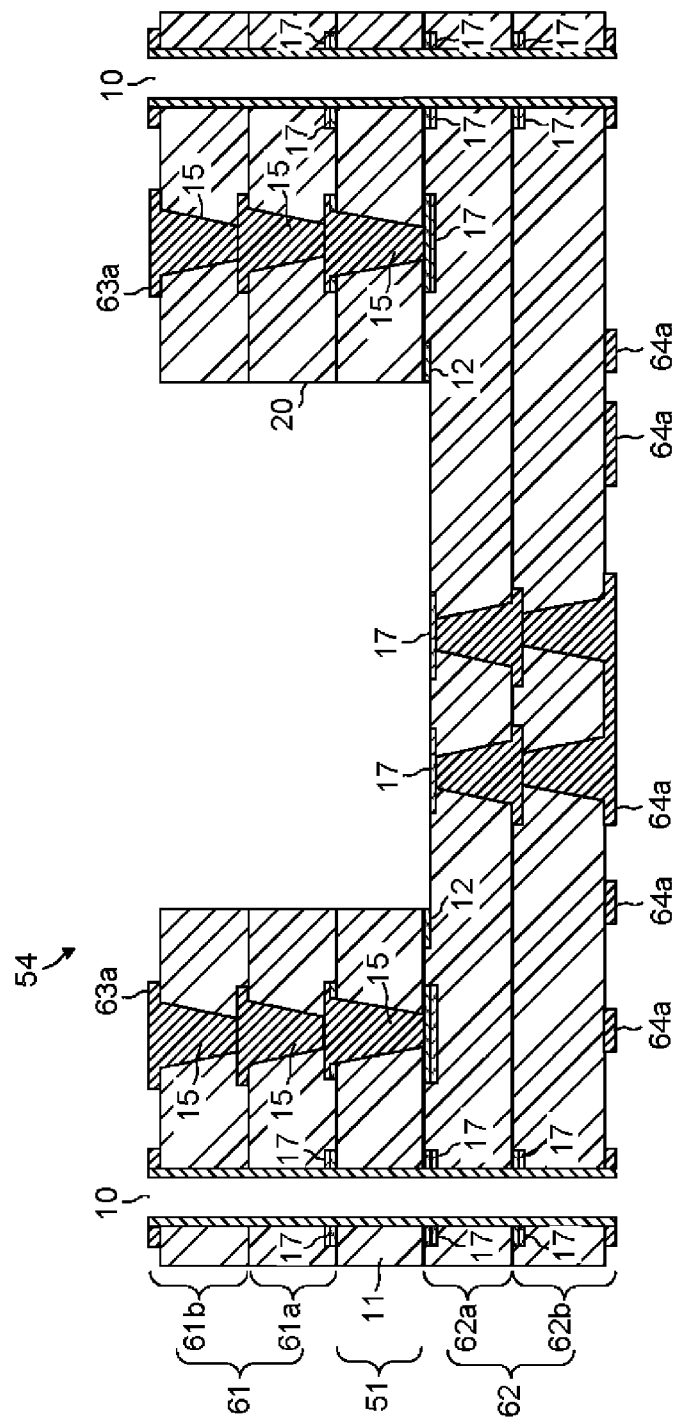
FIG. 11 is a cross-sectional view illustrating a manufacturing method for a printed wiring board according to one embodiment.

In this step, by etching the electrical conductor layer 64 of the second build-up layer 62 in the lower portion of the multilayer substrate 54 formed as in FIG. 10 to remove a partial region, an electrical conductor layer 64a is formed as a circuit as illustrated in FIG. 11. Additionally, by etching the electrical conductor layer 63 of the first build-up layer 61 in the upper portion of the substrate, a partial region is removed to form the electrical conductor layer 63a as a circuit wiring or wiring pattern. The outer layer circuit may be formed by a subtractive method in which an electrodeposition resist having excellent followability to the wall surface of a recess or a through-hole is used as an etching resist. The electrodeposition resist is an etching resist to which the properties of electrodeposition coating are applied.

Solder Resist Step

Figure 12:
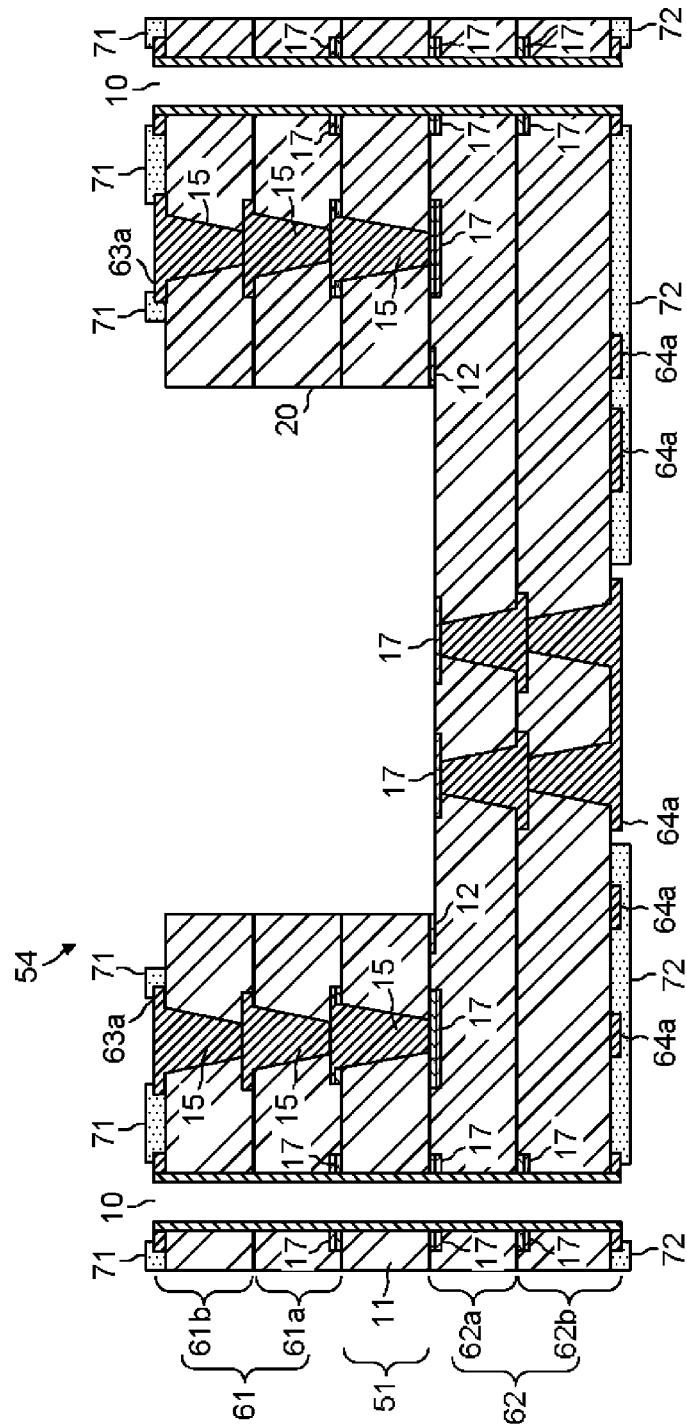
FIG. 12 is a cross-sectional view illustrating a manufacturing method for a printed wiring board according to one embodiment.

In this step, an insulating coating film is formed on the first build-up layer 61 and the second build-up layer 62 illustrated in FIG. 11, including a portion of the electrical conductor layer 63a and 64a, forming the solder resist 71 and the solder resist 72 as illustrated in FIG. 12. A dry film type or a liquid type may be used as a solder resist.

Forming Step of Electronic Component Mounting Location

This process and subsequent processes are performed when a step is required for the component mounting land.

Figure 13:
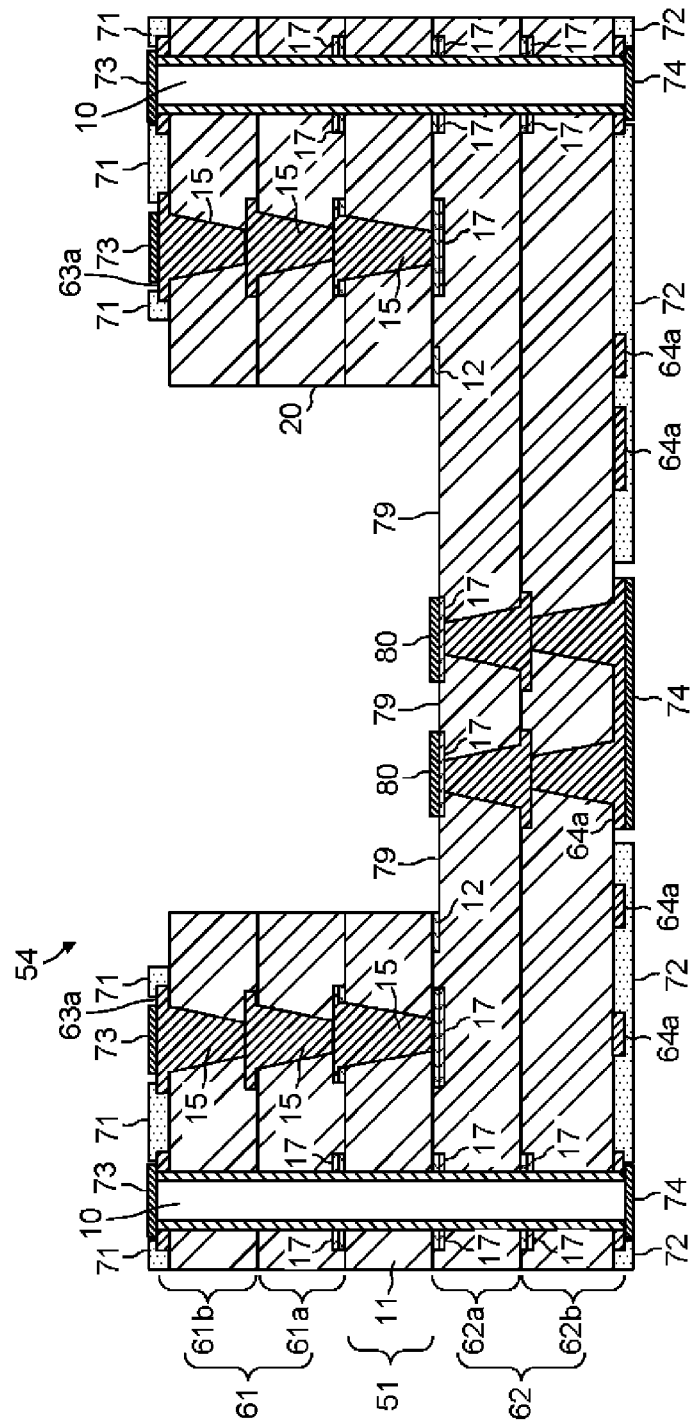
FIG. 13 is a cross-sectional view illustrating a manufacturing method for a printed wiring board according to one embodiment.

In this step, as illustrated in FIG. 13, plating is performed on the electrical conductor layer 17 exposed at the bottom portion of the cavity 20 to form the metal plating layer 80, and a connection pad, which is a component mounting land having a step from the bottom surface, is formed.

The electrical conductor layer 73 may be formed by plating similarly on the electrical conductor layer 63a of the first build-up layer 61 on the upper portion of the multilayer substrate 54. At this time, when the through-hole 10 is filled with resin or metal, the upper and lower portions of the through-hole 10 without the solder resist 71 are also plated, so that the electrical conductor layer 73 is also formed there. The same applies to the electrical conductor layer 74.

As required, a process of implementing electronic components may be added as follows. In this step, an electronic component is housed in the cavity 20, and an electrode provided at a bottom portion of the electronic component and the metal plating layer 80 (connection pad) are brought into contact with each other to connect circuits of each other. It should be noted that when the electronic component is not mounted here, but mounted in another step, the steps including and below the electronic component mounting step are unnecessary.

A printed wiring board according to the present embodiment includes the core substrate 51 including: the insulating resin substrate 11 having a first face (upper surface), and a second face (lower surface) back to back; the seed layer 12 formed on the second face (lower surface); and the electrical conductor layer 17 formed by pattern plating on a partial region of the seed layer 12. In the printed wiring board, the cavity 20 is formed by counterboring a partial region (cavity forming region 65) of the insulating resin substrate 11 from the side of the first face (upper surface) against a substrate (multilayer substrate 54) with a plurality of layers in which the build-up layer 62 is formed by building up with an insulating resin at least on a lower layer (lower surface of the insulating resin substrate 11) of the core substrate 51 such that the seed layer 12 on the second face (lower surface) of the insulating resin substrate 11 is exposed at the bottom. Then, the seed layer 12 exposed at the bottom of the cavity 20 is removed by flash etching, as a result, the electrical conductor layer 17 is embedded in the surface 79 of the second insulating resin layer 62a of the build-up layer 62 positioned below the remaining core substrate 51 such that the upper surface of the electrical conductor layer 17 is substantially flush with the surface 79. By providing the cavity 20 and the electrical conductor layer 17 in this way, the circuit connection between an electronic component housed in the cavity 20 and the substrate can be performed at the bottom of the electronic component.

In addition, in the printed wiring board illustrated in FIG. 10, a case of manufacturing a printed wiring board in which the cavity 20 is configured such that the upper surface of the fourth insulating resin layer 62b is the bottom surface instead of the upper surface of the second insulating resin layer 62a being the bottom surface will be described below. Note that the same parts as those of the manufacturing method for the printed wiring board illustrated in FIG. 10 are omitted.

Insulating Layer Processing Step to Build-Up Layer Forming Step

In this case, instead of the step of forming the electrical conductor layer 17 by performing pattern plating on a partial region of the seed layer provided on the second face (lower surface) of the insulating resin substrate 11 in the above-described step, a step is provided in which the seed layer 12 is provided on the second insulating resin layer 62a (lower surface), and pattern plating is performed on a partial region of the seed layer 12 to form the electrical conductor layer 17. The method for forming the seed layer 12 and the method for forming the electrical conductor layer 17 by pattern plating, can be performed in the same manner as described above.

The formation of the first build-up layer 61 and the second build-up layer 62 is similar to the above except that when forming the fourth insulating resin layer 62b on (the lower surface) the second insulating resin layer 62a, the fourth insulating resin layer 62b is formed such that the electrical conductor layer 17 is embedded therein.

Cavity Forming Step

In the counterboring process 1, the cavity forming region 65 is drilled in the lamination direction from the upper surface of the first build-up layer 61 toward the seed layer 12 on the lower surface of the second insulating resin layer 62a. The cavity 20 is formed by penetrating the first build-up layer 61 and the substrate, and by removing the insulating resin constituting the second insulating resin layer 62a such that a portion 68 of the second insulating resin layer 62a remains on a partial region of the seed layer 12 inside the second insulating resin layer 62a. In the counterboring process 2, by using the seed layer 12 as the shielding member of the laser beam, the portion 68 that remains is removed, which is a portion of the second insulating resin layer 62a left in the cavity 20, by the laser machining process, to expose the seed layer 12 at the bottom of the cavity 20. The drilling process and laser machining process can be carried out in the same manner as described above.

Seed Layer Removing Step

In this step, the seed layer 12 exposed on the bottom portion of the cavity 20 is removed by the flash etching to expose the surface 79 of the fourth insulating resin layer 62b and the surface of the electrical conductor layer 17 embedded in the insulating resin, and this step can be performed by the similar operation to the above. Further, the outer layer circuit forming step to the forming step of electronic component mounting location can be performed in the same manner as described above.

By forming, as a connection pad (component mounting land), the electrical conductor layer 17, which is substantially flush with the bottom surface of the cavity 20 and connected to the electrode at the bottom of the electronic component, the peel strength of the component mounting land as the wiring pattern at the bottom of the cavity 20 can be improved.

The example of the manufacturing procedure for the printed wiring board in each of the above-described embodiments is an example, and it is also possible to variously change the processing steps by replacing each processing step, adding a new processing step, or deleting a portion of the processing steps.

Although the embodiments of the present disclosure has been described, the embodiments are illustrated as examples, various other embodiments can be implemented, and omission, replacement, and change of the configuration elements can be performed without departing from the scope of the invention.

REFERENCE SIGNS LIST

10 Through-hole
11 Insulating resin substrate
12 Seed layer
13, 18 Dry film
14 Via hole
15 Via
16, 17, 63, 64 Electrical conductor layer
20 Cavity
51 Core substrate
54 Multilayer substrate
61 First build-up layer
62 Second build-up layer
61a, 61b, 62a, 62b Insulating resin layer
66 Drill
68 Portion of insulating resin substrate (Portion that remains)
71, 72 Solder resist
79 Surface of insulating resin layer
80 Metal plating layer

The invention claimed is:

1. A printed wiring board comprising
an insulating resin substrate comprising a first face and a second face located on a side opposite to the first face, a multilayer substrate laminated with the insulating resin layer and an electrical conductor layer on at least the first face, and a cavity, penetrating the insulating resin substrate, and comprising the insulating resin layer and the electrical conductor layer as a bottom surface, wherein the electrical conductor layer located on the bottom surface of the cavity is embedded in the insulating resin layer, and a position of a surface of the electrical conductor layer is equivalent to a position of the surface of the insulating resin layer, and wherein a side surface of the cavity extends linearly from the first face to the second face when the cavity is viewed in cross section.

2. The printed wiring board according to claim 1, wherein the electrical conductor layer comprises a connection pad with an electronic component.

3. The printed wiring board according to claim 2, wherein the electrical conductor layer comprises a circuit wiring connected to the connection pad in a planar direction.

4. The printed wiring board according to claim 1, wherein the multilayer substrate further comprises a second insulating resin layer (62a) and a fourth insulating resin layer (62b) from a side of the first face, and wherein the bottom surface of the cavity is an upper surface of the fourth insulating resin layer (62b).

5. The printed wiring board according to claim 1, wherein the electrical conductor layer located on the bottom surface of the cavity is embedded in the insulating resin layer, and the position of the surface of the electrical conductor layer is deep up to 3 μm from the position of the surface of the insulating resin layer.

* * * * *